(12) United States Patent
Lee et al.

(10) Patent No.: US 9,583,689 B2
(45) Date of Patent: Feb. 28, 2017

(54) LED PACKAGE

(71) Applicants: LITE-ON OPTO TECHNOLOGY (CHANGZHOU) CO., LTD., Jiangsu Province (CN); LITE-ON TECHNOLOGY CORP., Taipei (TW)

(72) Inventors: Yi-Fei Lee, Taipei (TW); Tsan-Yu Ho, Taipei (TW); Shih-Chang Hsu, Taipei (TW); Chen-Hsiu Lin, Taipei (TW)

(73) Assignees: Lite-On Opto Technology (Changzhou) Co., Ltd., Jiangsu Province (CN); Lite-On Technology Corp., Taipei (TW)

( * ) Notice: Subject to any disclaimer, the term of this patent is extended or adjusted under 35 U.S.C. 154(b) by 0 days.

(21) Appl. No.: 14/327,643

(22) Filed: Jul. 10, 2014

(65) Prior Publication Data

US 2015/0034986 A1    Feb. 5, 2015

Related U.S. Application Data

(63) Continuation-in-part of application No. 14/309,989, filed on Jun. 20, 2014, now Pat. No. 9,515,241.

(30) Foreign Application Priority Data

Dec. 4, 2013    (CN) .......................... 2013 1 0647783

(51) Int. Cl.
*H01L 33/64*    (2010.01)
*H01L 33/62*    (2010.01)
(Continued)

(52) U.S. Cl.
CPC .......... *H01L 33/641* (2013.01); *F21V 19/001* (2013.01); *H01L 27/15* (2013.01);
(Continued)

(58) Field of Classification Search
CPC ....... H01L 33/641; H01L 33/62; H01L 33/50; H01L 33/382; H01L 33/54; H01L 33/486;
(Continued)

(56) References Cited

U.S. PATENT DOCUMENTS

2005/0253151 A1* 11/2005 Sakai et al. ..................... 257/79
2010/0201254 A1*  8/2010 Matsumura .................. 313/501
(Continued)

*Primary Examiner* — Zandra Smith
*Assistant Examiner* — Lauren R Bell
(74) *Attorney, Agent, or Firm* — Rosenberg, Klein & Lee

(57) ABSTRACT

An LED package includes a chip carrier, an adhesive layer, one high-voltage LED die, and an encapsulating member. The chip carrier defines a receiving space. The adhesive layer is disposed in the receiving space and has a thermal conductivity of larger than or equal to 1 W/mK. The high-voltage LED die is attached to the adhesive layer to be received in the reflective space and has a top surface formed with a trench. The trench of the high-voltage LED die is disposed at an optical center of the receiving space. The encapsulating member encapsulates the high-voltage LED die and includes a plurality of diffusers. The trench is embedded with the encapsulating member and has a width ranging from 1 μm to 10 μm and a depth of less than or equal to 50 μm.

19 Claims, 16 Drawing Sheets

Related U.S. Application Data

(60) Provisional application No. 61/845,526, filed on Jul. 12, 2013, provisional application No. 61/977,701, filed on Apr. 10, 2014.

(51) Int. Cl.
| | | |
|---|---|---|
| *F21V 19/00* | (2006.01) | |
| *H01L 27/15* | (2006.01) | |
| H01L 33/60 | (2010.01) | |
| H01L 33/48 | (2010.01) | |
| H01L 33/50 | (2010.01) | |
| H01L 33/54 | (2010.01) | |

(52) U.S. Cl.
CPC ............ *H01L 33/62* (2013.01); *H01L 33/486* (2013.01); *H01L 33/50* (2013.01); *H01L 33/54* (2013.01); *H01L 33/60* (2013.01); *H01L 2224/32245* (2013.01); *H01L 2924/10157* (2013.01); *H01L 2933/0033* (2013.01); *H01L 2933/0066* (2013.01); *H01L 2933/0091* (2013.01)

(58) Field of Classification Search
CPC ... H01L 33/60; H01L 33/483; H01L 25/0753; H01L 24/97; H01L 2933/0091; H01L 2933/0066; H01L 2933/0033; H01L 2224/32245; H01L 2224/48091; H01L 2224/48257; H01L 2224/48247; H01L 23/495; H01L 23/52; H01L 27/15; H01L 2924/10157

See application file for complete search history.

(56) References Cited

U.S. PATENT DOCUMENTS

| | | | |
|---|---|---|---|
| 2011/0193010 A1* | 8/2011 | Keite-Telgenbuscher et al. | 252/76 |
| 2011/0284900 A1* | 11/2011 | Kim | 257/98 |
| 2013/0062613 A1* | 3/2013 | Takeshita ............... H01L 33/62 | 257/76 |
| 2014/0183569 A1* | 7/2014 | Sun | 257/88 |
| 2014/0264426 A1* | 9/2014 | Yamashita et al. | 257/99 |
| 2014/0341242 A1* | 11/2014 | Murayama et al. | 372/36 |

* cited by examiner

LED PACKAGE

CROSS-REFERENCE TO RELATED APPLICATIONS

This application is a continuation-in-part (CIP) of co-pending U.S. patent application Ser. No. 14/309,989, filed on Jun. 20, 2014, and claims priorities of U.S. provisional Application No. 61/845,526, filed on Jul. 12, 2013, and U.S. provisional Application No. 61/977,701, filed on Apr. 10, 2014.

BACKGROUND OF THE INVENTION

1. Field of the Invention

The invention relates to a light-emitting diode (LED) package, more particularly to a light-emitting diode (LED) package by adopting a high-voltage LED die.

2. Description of the Related Art

Conventional 0.5 Watt-to-3 Watt LED packages, which are incorporated with phosphors, usually utilize two low-voltage (2.8 volts to 3.6 volts) blue LED dies in their designs in order to reach higher luminance. However, the two-LED design not only causes difficulties as well as increases the production cost in wire-bonding process, but also generates light-absorbing effect between the two blue LEDs, which may lower the luminance thereof.

SUMMARY OF THE INVENTION

Therefore, the object of the present invention is to provide an LED package that may alleviate the aforementioned drawbacks of the prior art.

The LED package of this invention can reach high luminance and high efficiency by adopting the high-voltage LED die thereto.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1A:
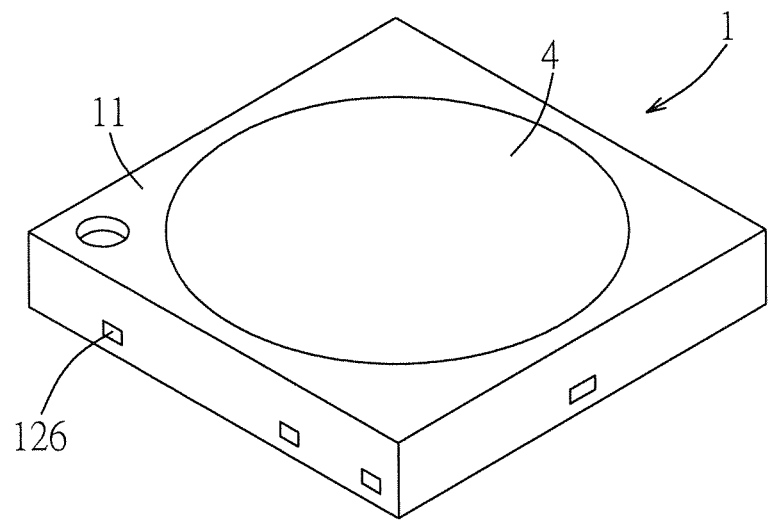
FIG. 1A is a perspective view of a first preferred embodiment of an LED package according to the invention.
Figure 1B:
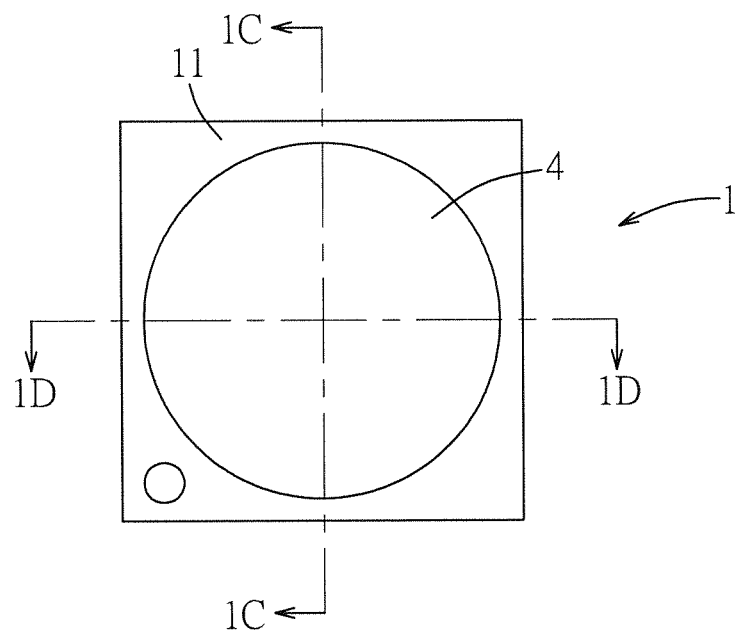
FIG. 1B is a top view of the first preferred embodiment.
Figure 1C:
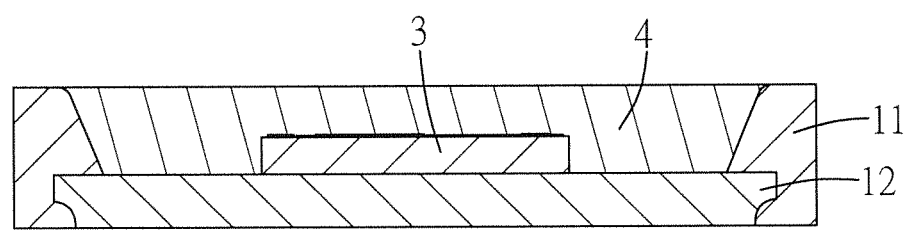
FIG. 1C is a sectional view of the first preferred embodiment taken along line 1C-1C of FIG. 1B.

Before the present invention is described in greater detail, it should be noted that like elements are denoted by the same reference numerals throughout the disclosure.

Referring to FIGS. 1A to 4C and FIGS. 5 to 7, the first preferred embodiment of an LED package according to the present invention is shown to include a chip carrier 1, an adhesive layer 2, one high-voltage LED die 3, and an encapsulating member 4.

The chip carrier 1 includes a reflector 11 that is made of a reflecting material, and a lead frame 12 including a pair of first and second metal segments 121, 122 (see FIGS. 1E to 3A) each of which is partially embedded in the reflector 11. The reflector 11 cooperates with the lead frame 12 to define a receiving space 13 and includes an insulating spacer 14 which is disposed between the first and second metal segments 121, 122 to electrically isolate the first metal segment 121 from the second metal segment 122, so that the first and second metal segments 121, 122 may serve respectively as a cathode and an anode, or vice versa. In this embodiment, the reflector 11 is made of an epoxy molding compound (EMC) and the LED package is configured in a quad flat no-lead (QFN) package.

Figure 1D:
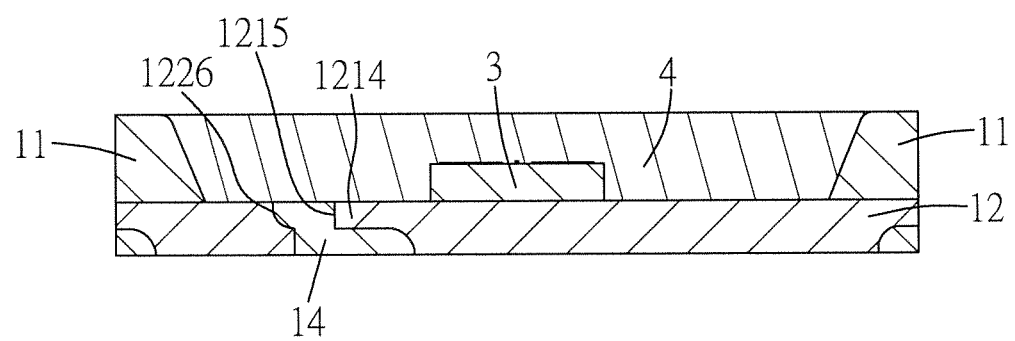
FIG. 1D is a sectional view of the first preferred embodiment taken along line 1D-1D of FIG. 1B.
Figure 1E:
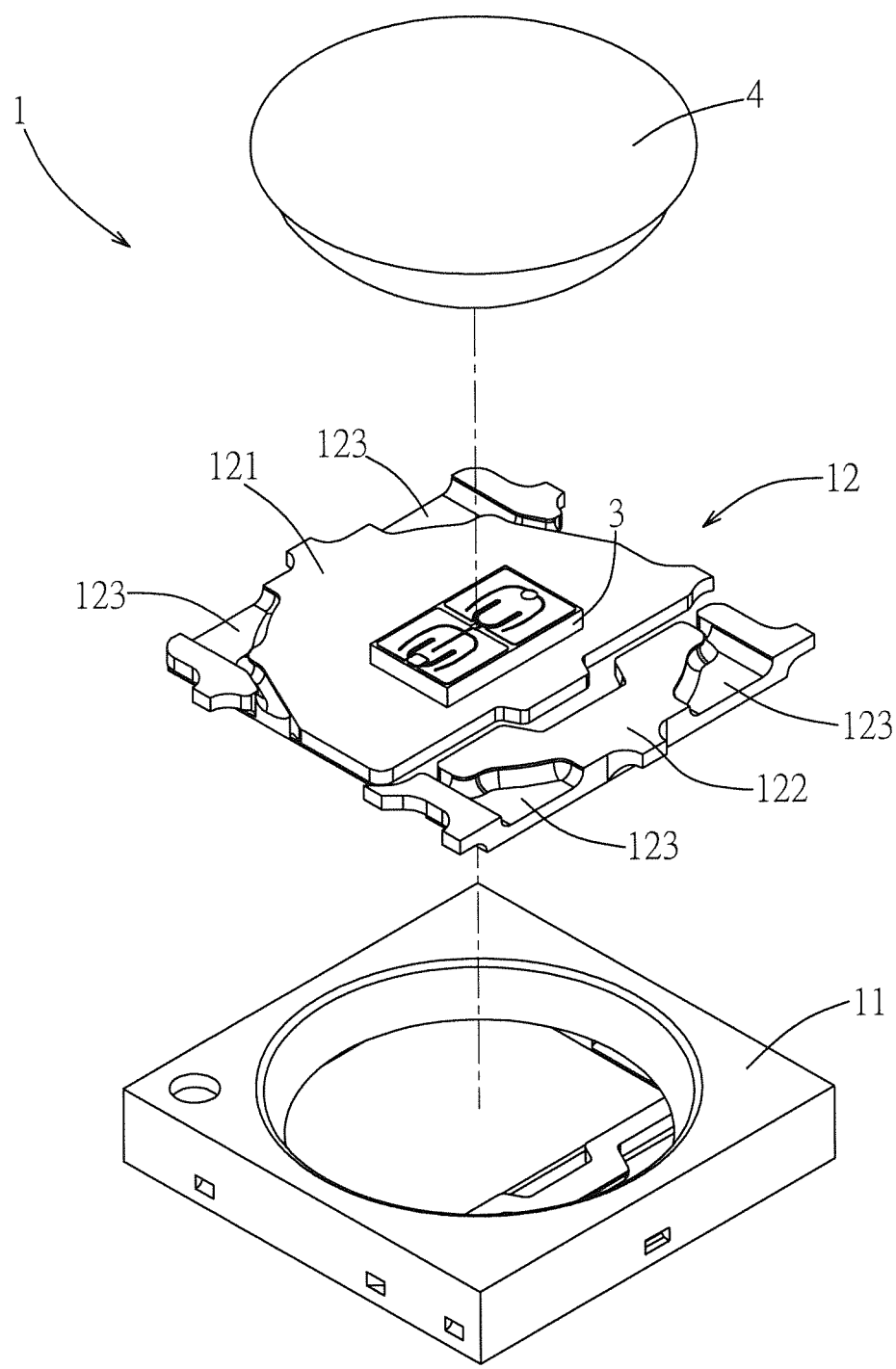
FIG. 1E is an exploded view of the first preferred embodiment.
Figure 1F:
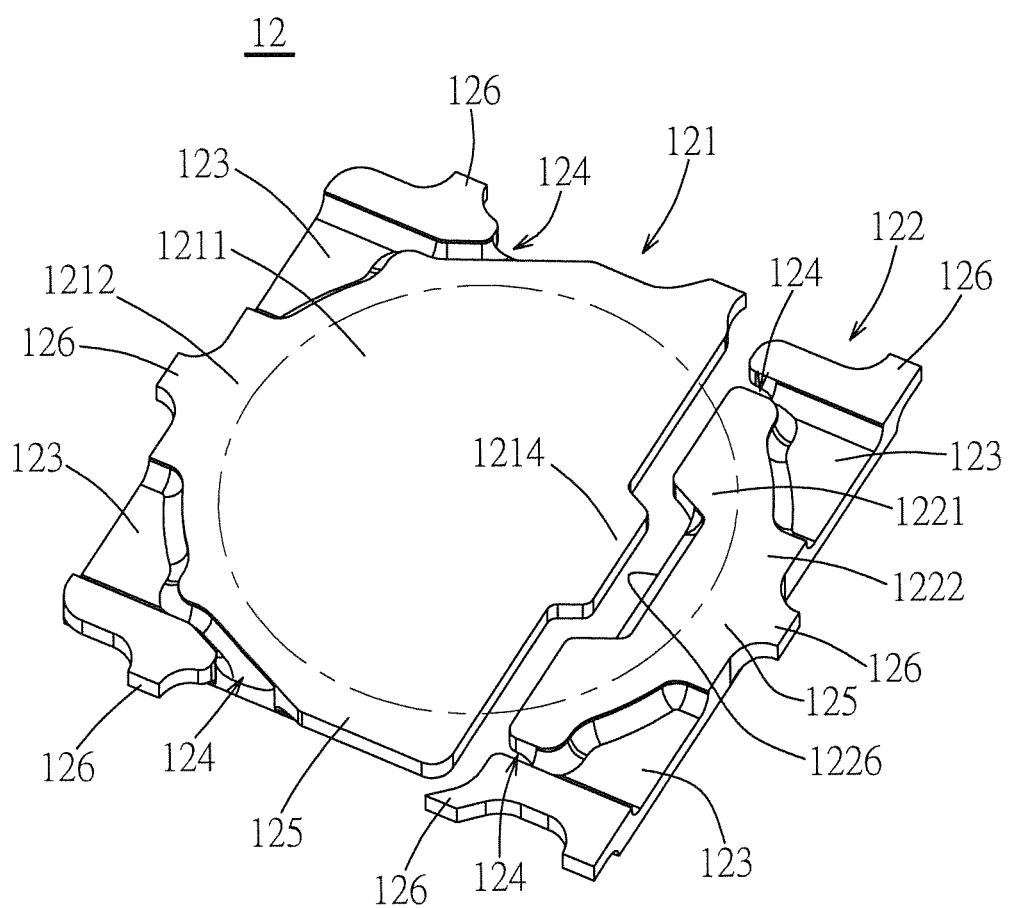
FIG. 1F is a perspective view of the first preferred embodiment illustrating a lead frame thereof.

In greater detail, as shown in FIGS. 1E and 1F, each of the first and second metal segments 121, 122 includes opposite top and bottom surfaces. The top surface of each of the first and second metal segments 121, 122 has an exposed zone 1211, 1221 that is exposed from the receiving space 13, and an embedded zone 1212, 1222 that is embedded within the reflector 11. The embedded zone 1212, 1222 of each of the first and second metal segments 121, 122 is formed with at least one engaging trench 123. In this embodiment, the embedded zone 1212, 1222 of each of the first and second metal segments 121, 122 is formed with two engaging trenches 123, and the engaging trenches 123 of the first and second metal segments 121, 122 are arranged in a manner to substantially surround the exposed zones 1211, 1221 (i.e., the receiving space 13), so as to increase the contact area between the reflector 11 and the lead frame 12 and to thus improve the engaging strength therebetween, as well as to reduce the opportunity for moisture to enter into the receiving space 13 of the chip carrier 11 through junctions between the reflector 11 and the lead frame 12.

Preferably, each of the engaging trenches 123 of the first and second metal segments 121, 122 has a depth ranging from ¼ to ¾ of a predetermined thickness of the lead frame 12. It should be noted that, in this embodiment, the predetermined thickness refers to a maximum thickness of the lead frame 12, and the depth of each of the engaging trenches 123 is half of the maximum thickness of the lead frame 12.

Preferably, a side surface of each of the first and second metal segments 121, 122, which interconnects the corresponding top and bottom surfaces of the first/second metal segment 121, 122, is formed with at least one indentation 124 embedded within the reflector 11, so as to increase contact area between the reflector 11 and the lead frame 12 and to thus improve the engaging strength therebetween.

Figure 1G:
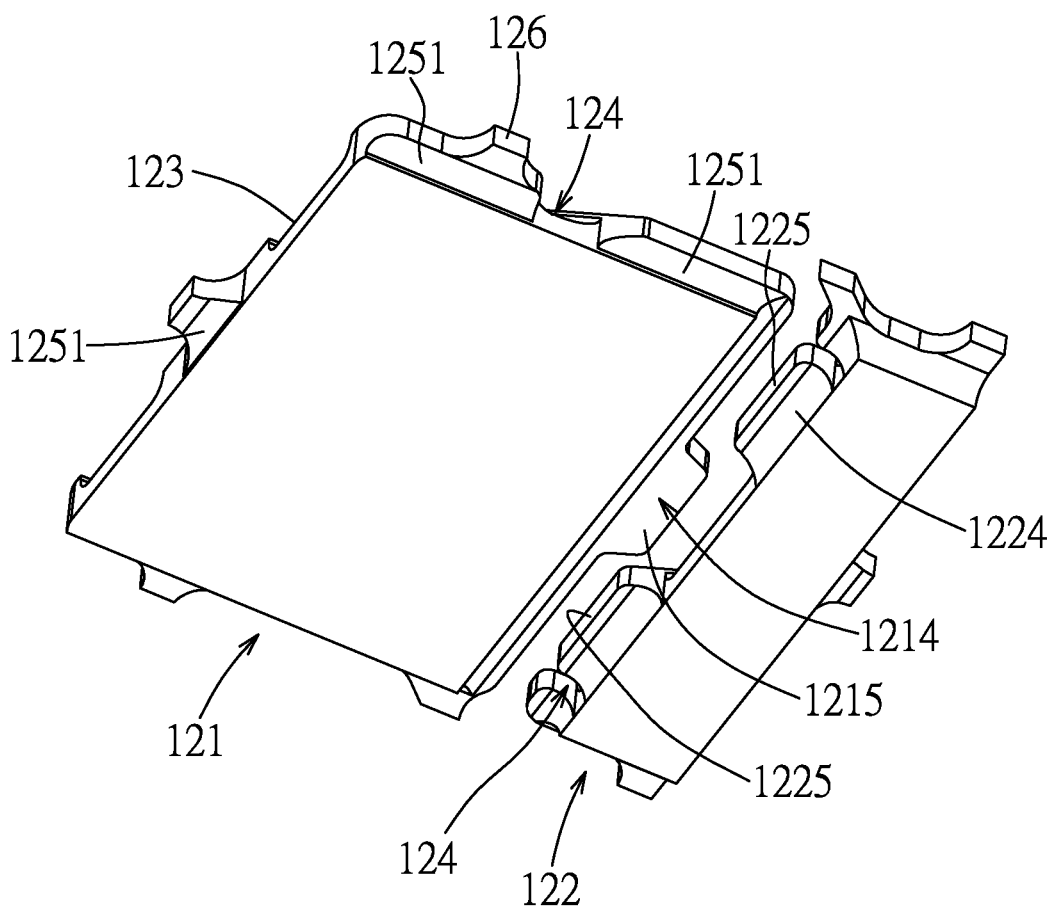
FIG. 1G is another perspective view of the lead frame of the first preferred embodiment.

Preferably, each of the first and second metal segments 121, 122 further includes a peripheral portion 125 that is covered by the reflector 11, that is provided with the engaging trenches 123, and that includes a plurality of connecting ends 126 each of which has a surface exposed from the reflector 11 (see FIGS. 1A, 1G and 2) and a thickness smaller than the maximum thickness of the lead frame 12. In this embodiment, as shown in FIG. 1G, the peripheral portion 125 of the first/second metal segment 121, 122 has at least one peripheral extending part 1251 that is formed by etching the bottom surface of the first/second metal segment 121, 122, so that a thickness of the extending part 1251 decreases radially and substantially away from the a soldering zone (i.e., the planar part) of the bottom surface of the first/second metal segment 121, 122. In this embodiment, the connecting ends 126 of the peripheral portions 125 have a minimum thickness, and preferably the minimum thickness of the connecting ends 126 ranges substantially from ¼ to ¾ of the maximum thickness of the lead frame 12, which is substantially the same as the depth of the engaging trenches 123.

Figure 2:
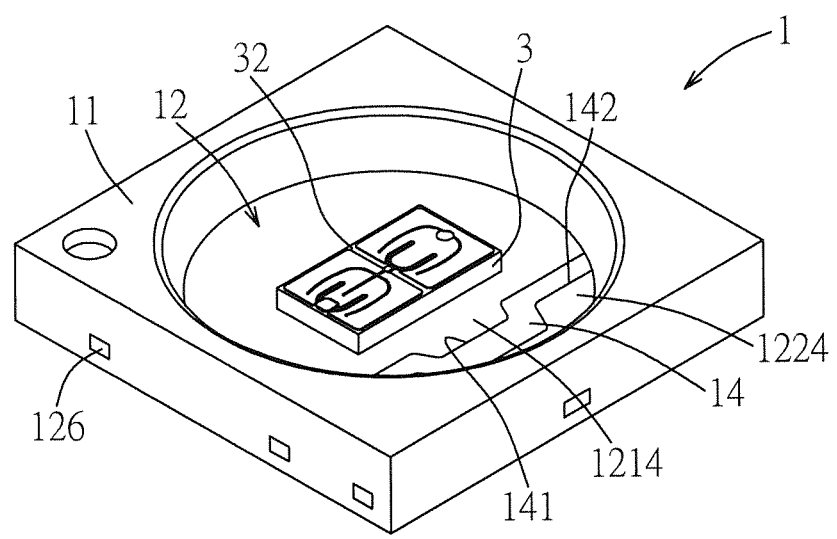
FIG. 2 is a perspective schematic diagram of the first preferred embodiment, illustrating a high-voltage LED die received in a receiving space of a chip carrier.

As shown in FIG. 2, the insulating spacer 14 is fittingly engaged with the first metal segment 121 and with the second metal segment 122. In this embodiment, the insulating spacer 14 has a top surface that is flush with the top surface of the lead frame 12, but the insulating spacer 14 may protrude from the top surface of the lead frame 12 in other embodiments of the present invention. In this embodiment, the insulating spacer 14 is formed with a first recess 141 facing the first metal segment 121, and two second recesses 142 facing the second metal segment 122. The first metal segment 121 further includes a first coupling portion 1214 which extends toward the second metal segment 122 to fittingly and directly engage the first recess 141 of the insulating spacer 14 and which has a coupling surface 1215 (see FIGS. 1D and 1G) in direct contact with the insulating spacer 14. The second metal segment 122 further includes two second coupling portions 1224 each of which extends toward the first metal segment 121 to fittingly engage a respective one of the second recesses 142 of the insulating spacer 14 and each of which has a coupling surface 1225 (see FIG. 1G) in direct contact with the insulating spacer 14. In this embodiment, the first coupling portion 1214 of the first metal segment 121 and the second coupling portions 1224 of the second metal segment 122 are in a staggered arrangement (as shown in FIGS. 1D and 1F), and the second coupling portions 1224 of the second metal segment 122 define a recess 1226 (as shown in FIG. 1F) therebetween that corresponds in position to the first coupling portion 1214 of the first metal segment 121. It is worth noting that, as shown in FIGS. 1D and 1G, each of the first and second coupling portions 1214, 1224 has a thickness that is smaller than the maximum thickness of the lead frame 12, making the coupling surface 1215, 1225 of each of the first and second coupling portions 1214, 1224 non-planar. That is, the coupling surfaces 1215, 1225 of the first and second coupling portions 1214, 1224 are curved and are not perpendicular to the bottom surfaces of the first and second metal segments 121, 122, respectively. Such configuration of the insulating spacer 14 and the first and second metal segments 121, 122 can provide sufficient resistance to relative sliding between the insulating spacer 14 and the first metal segment 121 and between the insulating spacer 14 and the second metal segment 122. In addition, the resulting curved (or stepped) junctions (see FIG. 1D) between the insulating spacer 14 and the first metal segment 121 and between the insulating spacer 14 and the second metal segment 122 could effectively reduce the opportunity for moisture to enter into the receiving space 13 from the external environment.

The adhesive layer 2 is disposed in the receiving space 13 and has a thermal conductivity of larger than or equal to 1 W/mK. In this embodiment, the adhesive layer 2 has a thickness ranging from 0.5 μm to 8 μm, and is made of a polymeric material (such as silicone) containing a plurality of heat-conductive particles, so as to exhibit the thermal conductivity of greater than or equal to 1 W/mK. Preferably, the thermal conductivity of the adhesive layer 2 is in a range between 1 and 20 W/mk. In other embodiments of the present invention, the adhesive layer 2 may have a thermal resistivity ($R_{th}$) of greater than or equal to 1 K/W, specifically in a range between 2.5 and 30 K/W. The incorporation of the heat-conductive particles into the adhesive layer 2 effectively enhances the ability of the adhesive layer 2 to transfer heat from the high-voltage LED die 3, thereby significantly lowering the possibility that the high-voltage LED die 3 becomes overheated. Preferably, the heat-conductive particles are made of zinc oxide, aluminum oxide, and combinations thereof.

Figure 3A:
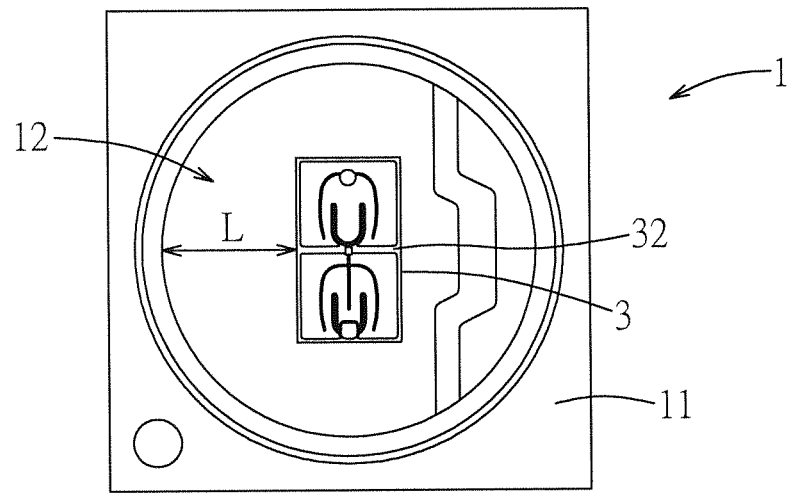
FIG. 3A is a top schematic view of the first preferred embodiment.
Figure 3B:
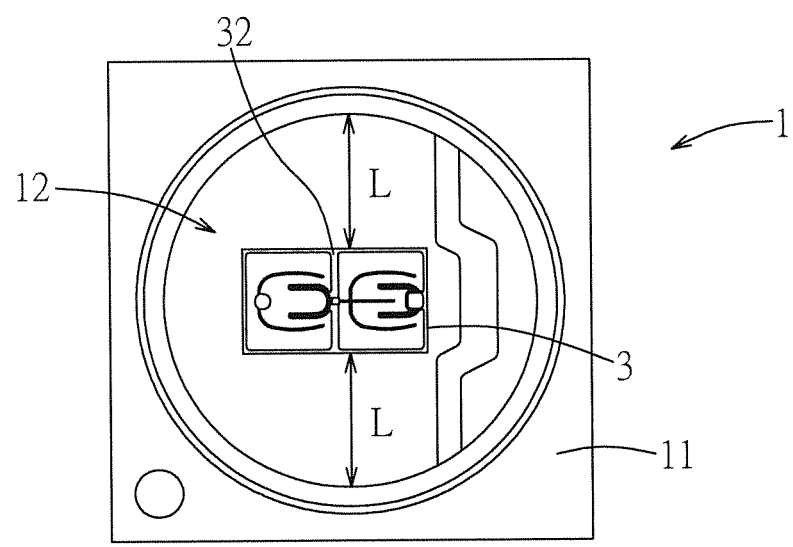
FIG. 3B is a top schematic view of a variation of the first preferred embodiment, illustrating that the high-voltage LED die is rotated by 90 degrees.

The high-voltage LED die 3 is attached to the adhesive layer 2 to be received in the receiving space 13 and has a top surface 31 formed with at least one trench 32. In this embodiment, the trench 32 of the high-voltage LED die 3 is disposed substantially at an optical center of the receiving space 13. In this embodiment, the optical center refers substantially to a geographical center of the receiving space 13. In a variation of the first preferred embodiment as shown in FIG. 3B, the high-voltage LED die 3 can be rotated by 90 degrees to be disposed in the receiving space 13 of the reflector 11. In this embodiment, a driving voltage (or forward voltage) of the high-voltage LED die 3 ranges from 5 volts to 7 volts, and the high-voltage LED die 3 emits light at a peak wavelength that ranges between 445 nm and 465 nm. Preferably, the driving voltage (or forward voltage) of the high-voltage LED die 3 ranges from 5.8 volts to 6.8 volts.

Figure 4A:
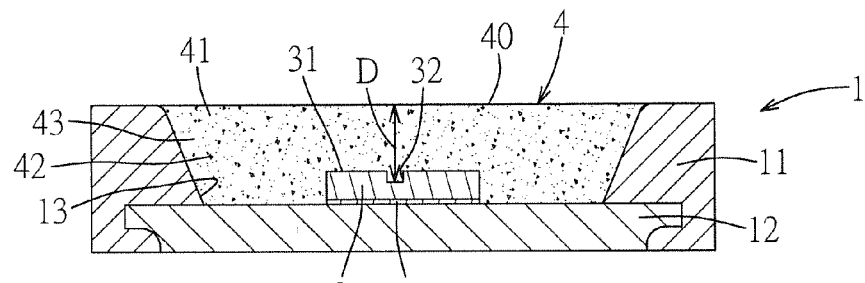
FIG. 4A is a schematic sectional view of the first preferred embodiment.
Figure 4B:
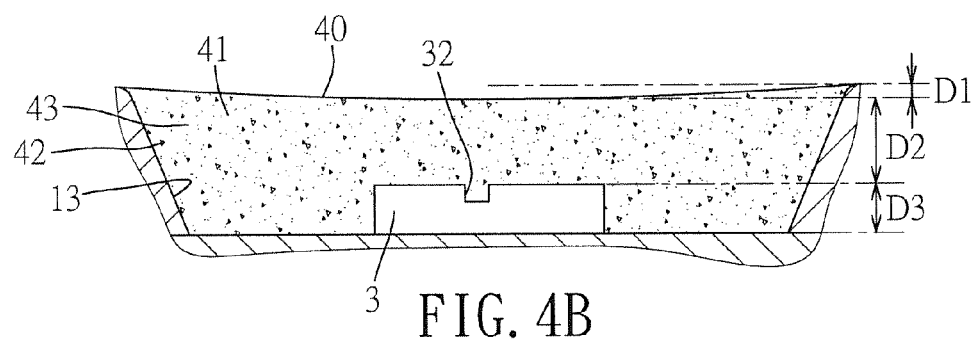
FIG. 4B is a schematic sectional view of the first preferred embodiment, illustrating the relationship between the high-voltage LED die and the encapsulating member.

The encapsulating member 4, which includes a polymeric material 41 containing a plurality of diffusers 42 and a plurality of phosphors 43, encapsulates the high-voltage LED die 3 in such a manner that the trench 32 of the high-voltage LED die 3 is embedded therein. Since the encapsulating member 4 is configured to have a top surface 40 concave toward the high-voltage LED die 3 due to surface tension as depicted in FIGS. 4A and 4B (the high-voltage LED die 3 is located substantially at the geographical center of the receiving space 13), the trench 32 of the high-voltage LED die 3 is capable of enhancing the bonding strength with the encapsulating member 4. Preferably, as shown in FIG. 4A, a maximum distance D between the top surface 40 of the encapsulating member 4 and the top surface 31 of the high-voltage LED die 3 is less than 0.5 mm.

In this embodiment, the polymeric material 41 of the encapsulating member 4 is silicone resin. Preferably, the diffusers 42 are scattering particles having amass median diameter ($D_{50}$) of less than or equal to 100 nm and are uniformly dispersed within the polymeric material 41 to scatter effectively the light transmitted from the high-voltage LED die 3 owing to their nano-scale sizes. Preferably, the diffusers 42 are made of silicon oxide ($SiO_2$) or titanium oxide ($TiO_2$). It should be noted that the diffusers 42 cannot be disposed merely within a bottom portion of the encapsulating member 4 if a relatively high efficiency in light conversion is desired.

It is worth noting that, in this embodiment, the high-voltage LED die 3 has four sides, and a maximum distance from either one of the four sides of the high-voltage LED die 3 to an outer contour of the reflector 11 is less than or equal to 1 mm. In greater detail, as shown in FIGS. 3A and 3B, the high-voltage LED die 3 has a pair of long edges and a pair of short edges, the distance (L) between either one of the long edges and a reflecting surface of the reflector 11 is less than or equal to 1 mm.

Referring to FIG. 4B, the relationship between the high-voltage LED die 3 and the encapsulating member 4 is illustrated. In this embodiment, the reflector 11 of the chip carrier 1 has a depth of about 0.33 mm. As mentioned earlier, the top surface 40 of the encapsulating member 4 are concavely curved to form a highest point and a lowest point due to surface tension. Therefore, in this embodiment, a distance d1 between the highest point and the lowest point of the encapsulating member 4 is about 0.033 mm, a distance d2 between the lowest point of the encapsulating member 4 and the top surface 31 of the high-voltage LED die 3 is about 0.127 mm, and a thickness d3 of the high-voltage LED die 3 is in a range of 110 to 150 μm. In simplicity, the receiving space 13 of the chip carrier 1 is merely deep enough to receive the high-voltage LED die 3, and a ratio of d2/d3 is substantially about 0.49.

Figure 4C:
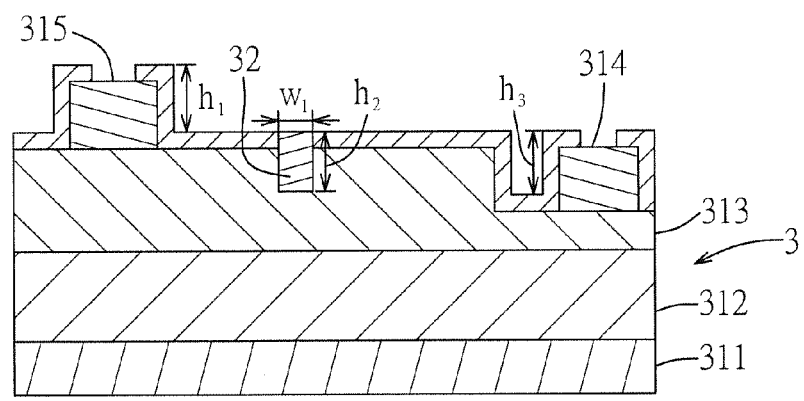
FIG. 4C is a schematic sectional view of the first preferred embodiment, illustrating that a trench is formed on a top surface of the high-voltage LED die.

Referring to FIG. 4C, a chip structure of the high-voltage LED die 3 is shown to include a reflecting layer 311, a sapphire substrate 312, an active layer 313, a N-type electrode 314, and a P-type electrode 315. The sapphire substrate 312 serves as a chip substrate. The reflecting layer 311 is formed beneath a bottom surface of the sapphire substrate. The active layer 313 is formed on a top surface of the sapphire substrate 312 to be a light-emitting layer. The P-type electrode 315 and the N-type electrode 314 are formed on the active layer 313. In this embodiment, the high-voltage LED die 3 is formed with two sub-LEDs, and the trench 32 is formed between the two sub-LEDs. In greater detail of this embodiment, a height h1 of the P-type electrode 315 is about 2 μm, a depth h2 of the trench 32 is less than or equal to 50 μm, a width W1 of the trench 32 is about 1 to 10 μm, and a height h3 of the N-type electrode 314 is about 1 μm.

The LED package having the high-voltage LED die 3 allows the LED package of the present invention to improve the luminance performance, as well as to lower the production cost in comparison to conventional LED packages. In addition, the at least one trench 32 of the high-voltage LED die 3 provides relatively strong bonding strength between the encapsulating member 4 and the high-voltage LED die 3.

Figure 5:
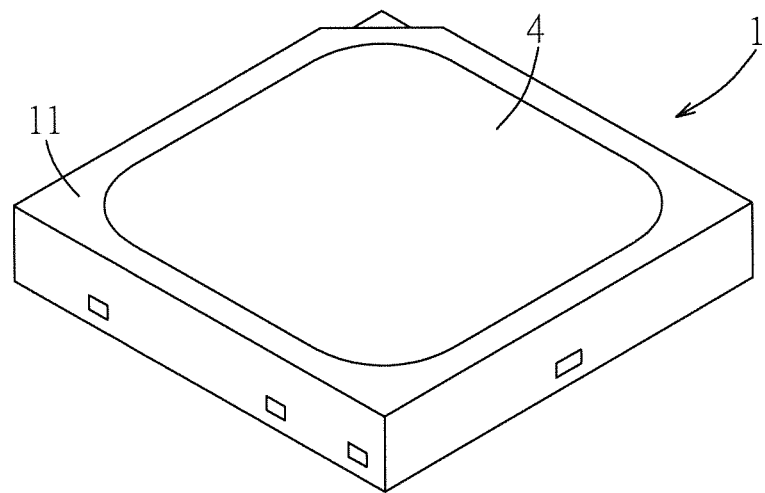
FIG. 5 is a perspective view of another variation of the first preferred embodiment.
Figure 6:
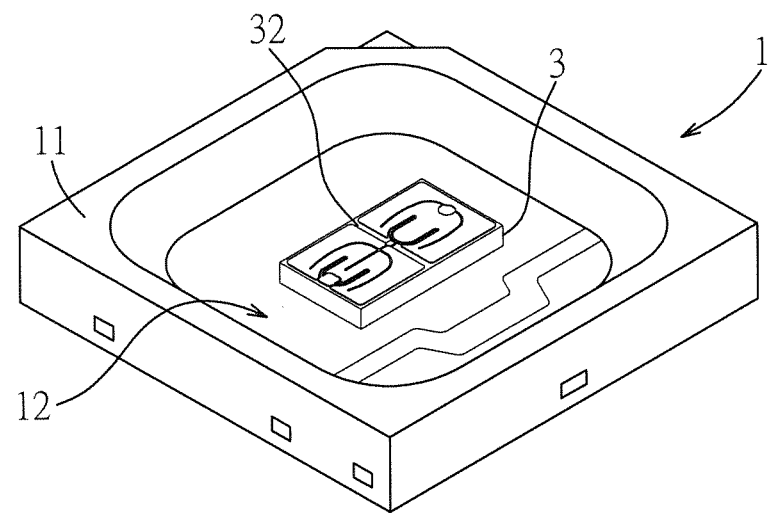
FIG. 6 is a perspective schematic diagram of the variation of the first preferred embodiment of FIG. 5, illustrating that the high-voltage LED die is received in the receiving space of the chip carrier.
Figure 7:
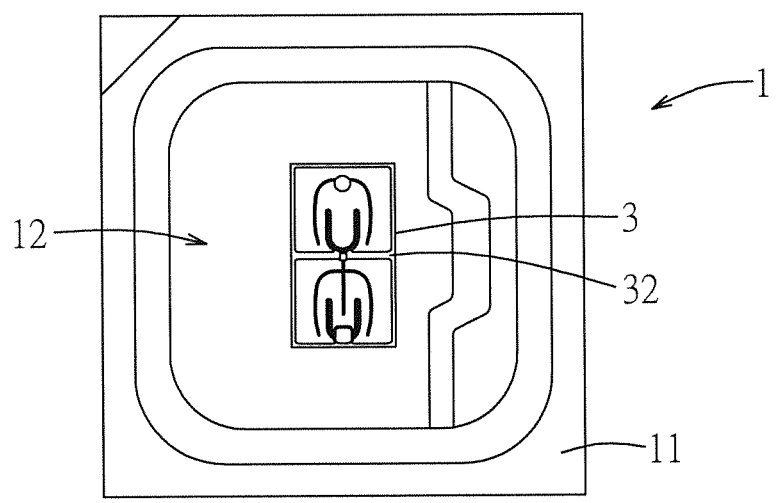
FIG. 7 is a top schematic view of the variation of the first preferred embodiment of FIG. 5.
Figure 8A:
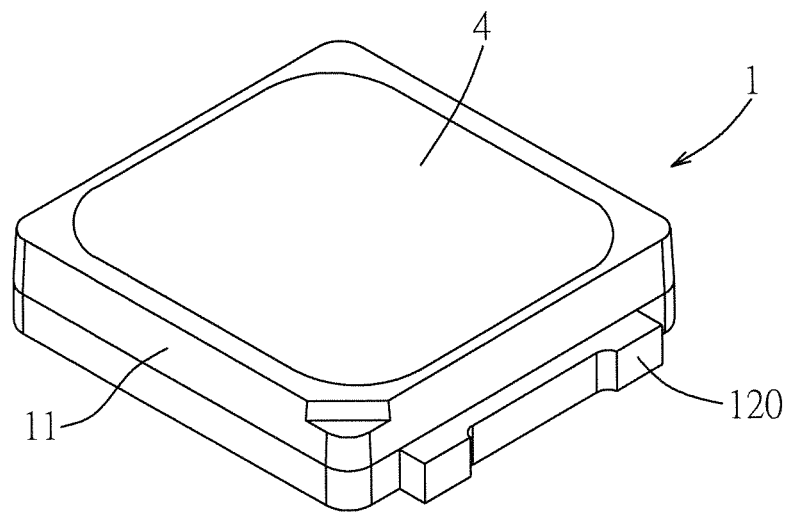
FIG. 8A is a perspective view of a second preferred embodiment of the LED package according to the present invention.
Figure 8B:
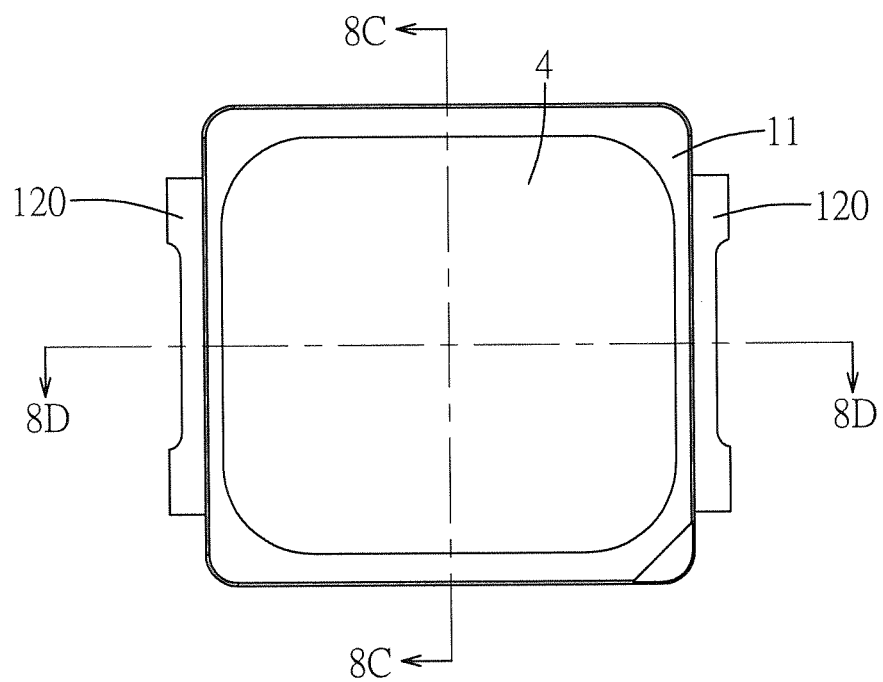
FIG. 8B is a top view of the second preferred embodiment.
Figure 8C:
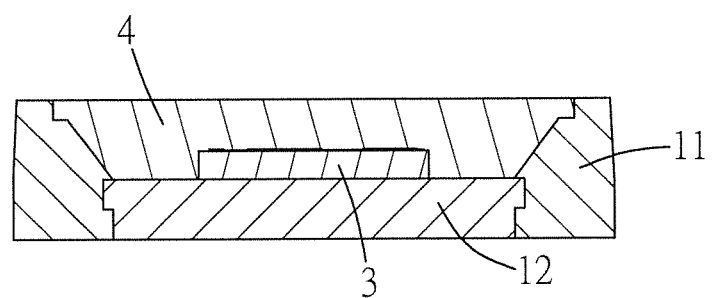
FIG. 8C is a sectional view of the second preferred embodiment taken along line 8C-8C of FIG. 8B.
Figure 8D:
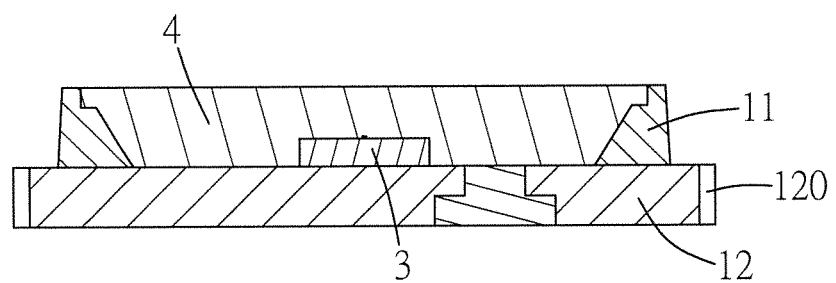
FIG. 8D is a sectional view of the second preferred embodiment taken along line 8D-8D of FIG. 8B.
Figure 8E:
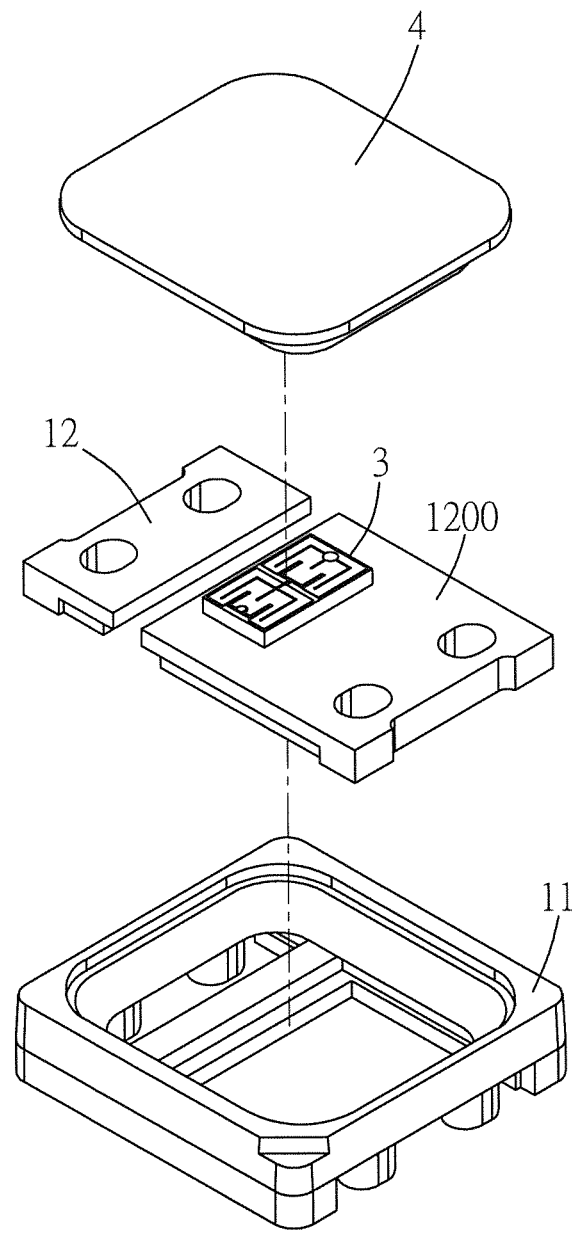
FIG. 8E is an exploded view of the second preferred embodiment.
Figure 9:
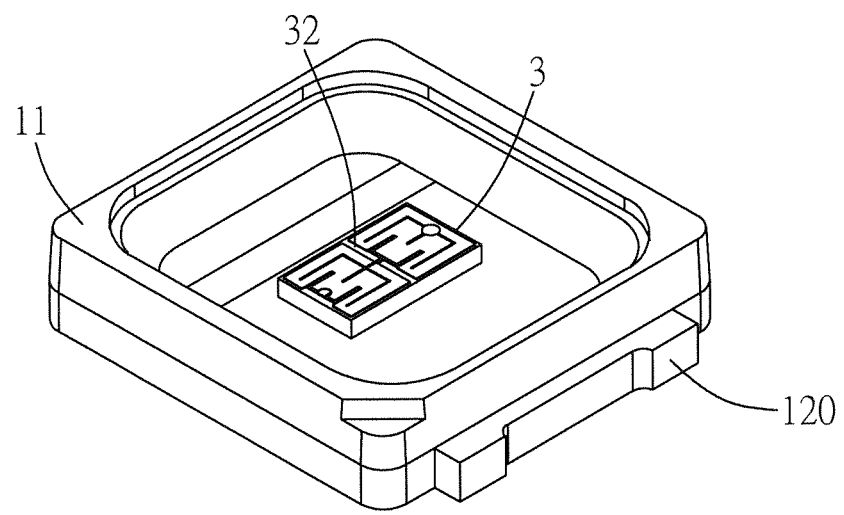
FIG. 9 is a perspective schematic view of the second preferred embodiment, illustrating that the high-voltage LED die is received in the receiving space of the chip carrier.
Figure 10:
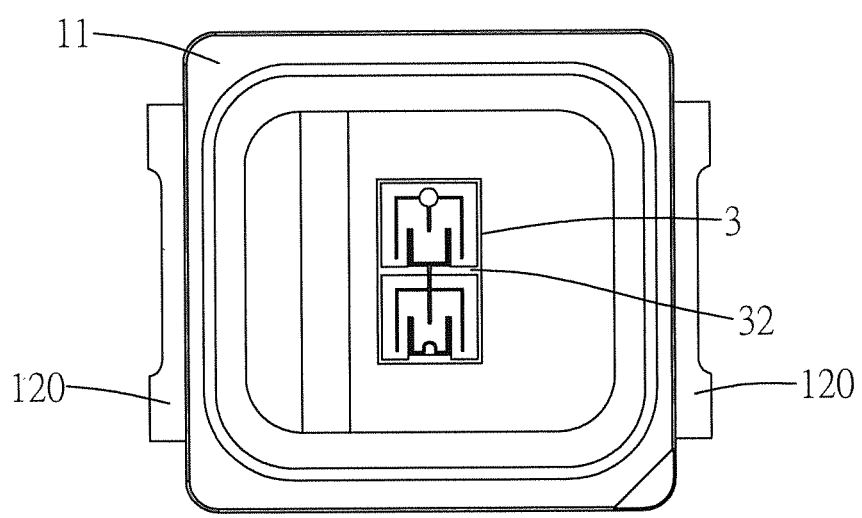
FIG. 10 is a top schematic view of the second preferred embodiment.
Figure 11:
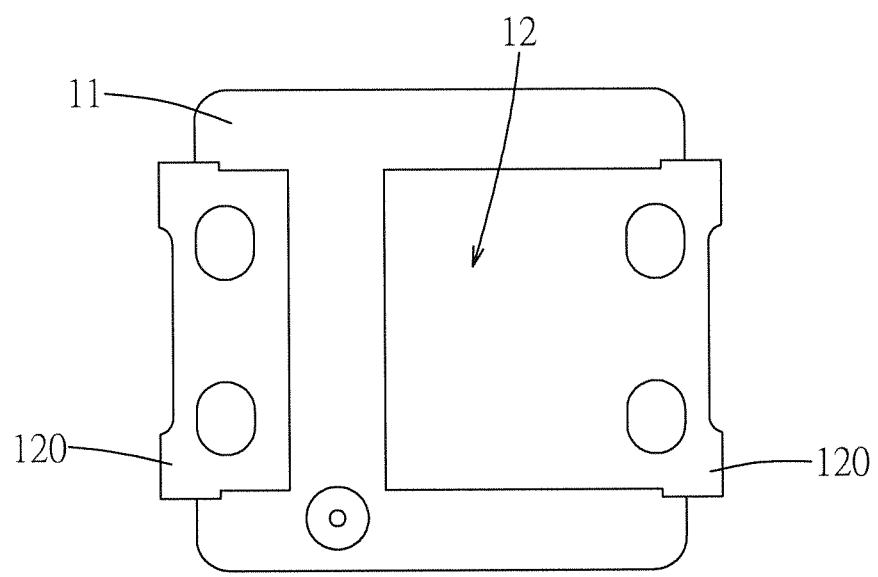
FIG. 11 is a bottom schematic view of the second preferred embodiment.

FIGS. 5 to 7 illustrate a variation of the first preferred embodiment which has advantages similar to those of the LED package depicted by FIGS. 1 to 4. The only difference therebetween resides in various shapes of the opening of the reflector 11. In more detail, the opening of the reflector 11 in FIGS. 5 to 7 has a substantially rectangular cross-section, and the opening of the reflector 11 in FIGS. 1A to 3B has a substantially circular cross-section.

Referring to FIGS. 8A to 8E and FIGS. 9 to 11, a second preferred embodiment of the LED package according to the present invention is shown to be similar to that of the first preferred embodiment. The difference therebetween resides in that the reflector of the second preferred embodiment is made of poly(1,4-cyclohexylenedimethylene terephthalate), and that the lead frame 12 of the second preferred embodiment has at least one extending portion 120 extending outwardly of an outer contour of the reflector 11. The LED package of the second preferred embodiment has the same advantages as those of the first preferred embodiment.

Figure 12A:
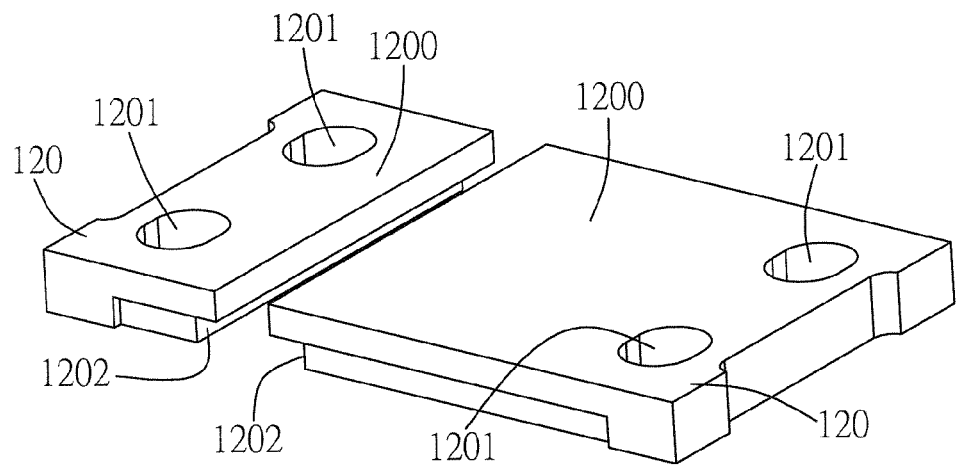
FIG. 12A is a top schematic view of the second preferred embodiment, illustrating that the chip carrier has two metal segments.
Figure 12B:
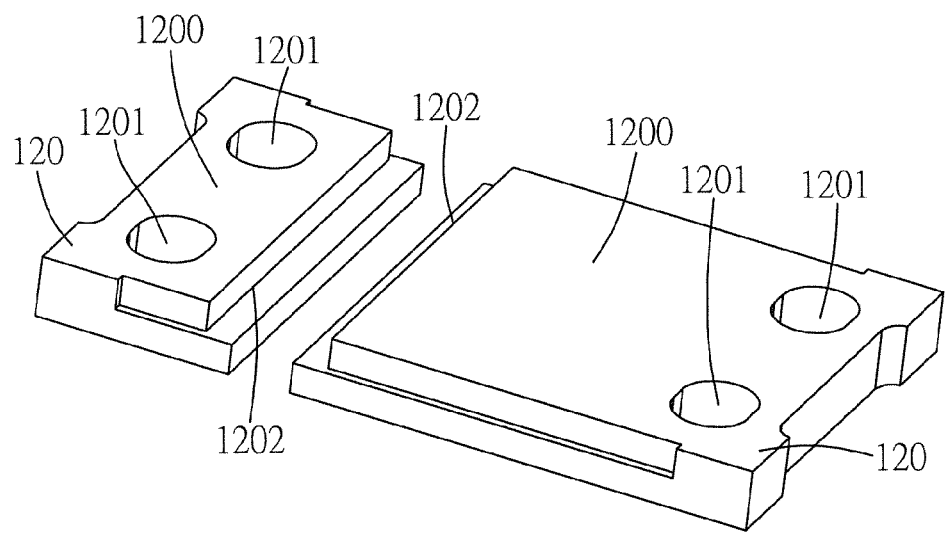
FIG. 12B is a bottom schematic view of the second preferred embodiment, illustrating the two metal segments.

FIGS. 12A and 12B further depict the configuration of the two metal segments 1200 of the second embodiment. The two metal segments 1200 are spaced apart from each other by means of the reflector 11. Each of the metal segments 1200 has two through holes 1201 to be located substantially at four distal corners to surround areas of the two metal segments 1200 corresponding in position to the embedded zone that is embedded within the reflector 11, respectively. A U-shaped groove 1202 is formed around an outer periphery of a bottom surface of each of the metal segments 120, which allows the reflector 11 to be stably engaged with the two metal segments 120.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An LED package comprising:
   a chip carrier having an optical center and defining a receiving space;
   an adhesive layer containing a plurality of thermal-conductive particles and having a thermal conductivity of larger than or equal to 1 W/mK;
   one high-voltage LED die having a driving voltage in range from 5-7 volts and attached to said adhesive layer in said receiving space, said high-voltage LED die having a top surface formed with at least one trench located substantially at said optical center of said receiving space, said at least one trench having a width ranging from 1 μm to 10 μm and a depth of less than or equal to 50 μm; and an encapsulating member encapsulating said high-voltage LED die;
wherein said at least one trench of said high-voltage LED die is embedded within said encapsulating member, and
wherein said chip carrier includes:
a reflector, and
a lead frame including first and second metal segments, said first and second metal segments each having a top surface including an embedded zone that is embedded within said reflector, said first and second metal segments each formed with a pair of spaced-apart engaging trenches engaged with said reflector, said engaging trenches of said first and second metal segments each being configured in a substantially triangular shape and located correspondingly at four corners of said lead frame, said embedded zones of said first and second metal segments each including a top plane and a pair of trench-defining surfaces connected to said top plane, each trench-defining surface respectively defining one of said engaging trenches, each trench-defining surface including a triangular-shaped bottom plane that is substantially parallel to said top plane.

2. The LED package according to claim 1, wherein a maximum distance between a top surface of said encapsulating member and said top surface of said high-voltage LED die is less than 0.5 mm.

3. The LED package according to claim 1, wherein said high-voltage LED die has four sides, a maximum distance from any one of said four sides of said high-voltage LED die to an outer contour of said chip carrier being less than or equal to 1 mm.

4. The LED package according to claim 1, wherein said high-voltage LED die emits light at a peak wavelength that ranges between 445 nm and 465 nm.

5. The LED package according to claim 1, wherein said reflector is made of an epoxy molding compound (EMC) or poly(1,4-cyclohexylenedimethylene terephthalate) (PCT).

6. The LED package according to claim 5, being configured in a quad flat no-lead (QFN) package.

7. The LED package according to claim 1, wherein said adhesive layer is made of a polymeric material containing said thermal-conductive particles, said thermal-conductive particles being selected from the group consisting of zinc oxide, aluminum oxide, and combinations thereof.

8. The LED package according to claim 7, wherein said adhesive layer has a thickness ranging from 0.5 μm to 8 μm.

9. The LED package according to claim 1, wherein said encapsulating member further comprises a diffuser, said diffuser being particles having a mass median diameter of less than or equal to 100 nm.

10. The LED package according to claim 9, wherein said encapsulating member is made from a polymeric material in which a phosphor material and said diffuser are dispersed.

11. The LED package according to claim 1, wherein the thermal conductivity of said adhesive layer is in a range between 1 and 20 W/mK.

12. The LED package according to claim 1, wherein each of said first and second metal segments of said lead frame has a maximum thickness, and each of said engaging trenches of said first and second metal segments has a depth that ranges from ¼ to ¾ of the maximum thickness.

13. The LED package according to claim 1, wherein said engaging trenches of said first metal segment and said engaging trenches of said second metal segment are arranged to substantially surround said receiving space.

14. The LED package according to claim 1, wherein said reflector includes an insulating spacer that is disposed between said first and second metal segments and that electrically isolates said first metal segment from said second metal segment, said insulating spacer being fixedly engaged with said first metal segment and with said second metal segment.

15. The LED package according to claim 14, said first metal segment has a first coupling portion extending toward said second metal segment to fittingly engage said insulating spacer, and said second metal segment has a second coupling portion extending toward said first metal segment to fittingly engage said insulating spacer.

16. The LED package according to claim 15, wherein said second metal segment has two of said second coupling portions to define a recess therebetween, and said recess of said second metal segment corresponds in position to said first coupling portion of said first metal segment.

17. The LED package according to claim 15, wherein said first coupling portion of said first metal segment has a curved coupling surface fittingly contacting said insulating spacer, and said second coupling portion of said second metal segment has a curved coupling surface fittingly contacting said insulating spacer.

18. An LED package comprising:
a chip carrier having an optical center and defining a receiving space; an adhesive layer containing a plurality of thermal-conductive particles and having a thermal resistivity of larger than or equal to 1 K/W;
one high-voltage LED die having a driving voltage in range from 5-7 volts and attached to said adhesive layer in said receiving space, said high-voltage LED die having a top surface formed with at least one trench located substantially at said optical center of said receiving space, said at least one trench having a width ranging from 1 μm to 10 μm, and a depth of less than or equal to 50 μm; and
an encapsulating member encapsulating said high-voltage LED die; wherein said at least one trench of said high-voltage LED die is embedded within said encapsulating member, and
wherein said chip carrier includes:
a reflector, and
a lead frame including first and second metal segments, said first and second metal segments each having a top surface including an embedded zone that is embedded within said reflector, said first and second metal segments each formed with a pair of spaced-apart engaging trenches engaged with said reflector, said engaging trenches of said first and second metal segments each being configured in a substantially triangular shape and located correspondingly at four corners of said lead frame, said embedded zones of said first and second metal segments each including a top plane and a pair of trench-defining surfaces connected to said top plane, each trench-defining surface respectively defining one of said engaging trenches, each trench-defining surface including a triangular-shaped bottom plane that is substantially parallel to said top plane.

19. The LED package according to claim 18, wherein the thermal resistivity of said adhesive layer is in a range between 2.5 and 30 K/W.

* * * * *